United States Patent
Gustat

(10) Patent No.: US 7,629,841 B2
(45) Date of Patent: Dec. 8, 2009

(54) SIGMA-DELTA MODULATOR WITH FEEDBACK FOR POWER AMPLIFIERS

(75) Inventor: Hans Gustat, Heidesee/OT Prieros (DE)

(73) Assignee: IHP-GmbH - Innovations for High Performance Microelectronics/Institut fur Innovative Mikroelektronik, Frankfurt (DE)

( * ) Notice: Subject to any disclaimer, the term of this patent is extended or adjusted under 35 U.S.C. 154(b) by 1 day.

(21) Appl. No.: 11/986,289

(22) Filed: Nov. 19, 2007

(65) Prior Publication Data
US 2008/0180166 A1    Jul. 31, 2008

(30) Foreign Application Priority Data
Nov. 21, 2006    (DE)    ........................ 10 2006 055 577

(51) Int. Cl.
H03F 3/38    (2006.01)
(52) U.S. Cl. ......................................... 330/10; 330/251
(58) Field of Classification Search .................. 330/10, 330/251, 207 A
See application file for complete search history.

(56) References Cited

U.S. PATENT DOCUMENTS

| | | |
|---|---|---|
| 5,157,395 A | 10/1992 | Del Signore et al. |
| 5,606,289 A | 2/1997 | Williamson |
| 5,815,585 A | 9/1998 | Klippel |
| 6,252,455 B1 | 6/2001 | Kurby et al. |
| 6,373,334 B1 * | 4/2002 | Melanson ..................... 330/10 |
| 6,466,087 B2 * | 10/2002 | Ruha ............................ 330/10 |
| 6,717,392 B2 * | 4/2004 | Pearson ..................... 324/76.11 |
| 6,759,899 B2 * | 7/2004 | Lennartson et al. ........... 330/10 |
| 6,768,779 B1 | 7/2004 | Nielsen |
| 6,822,592 B2 | 11/2004 | Gandolfi et al. |
| 6,977,546 B2 * | 12/2005 | Stapleton ..................... 330/10 |
| 7,035,124 B2 | 4/2006 | Chadwick et al. |
| 2005/0253649 A1 | 11/2005 | Morishima |
| 2006/0145900 A1 | 7/2006 | Clement et al. |

FOREIGN PATENT DOCUMENTS

| | | |
|---|---|---|
| WO | WO 00/42702 | 7/2000 |
| WO | WO 2006/061213 | 6/2006 |

OTHER PUBLICATIONS

Jack R. Smith: Modern Communication Circuits, Second edition, McGraw-Hill 1998; Chapter 11.

* cited by examiner

*Primary Examiner*—Henry K Choe
(74) *Attorney, Agent, or Firm*—Ware, Fressola, Van Der Sluys & Adolphson LLP

(57) ABSTRACT

The invention concerns an electronic circuit comprising a sigma-delta modulator and a power amplifier connected downstream thereof, wherein there is provided a feedback circuit (207) which is coupled between an output of the sigma-delta modulator and an input of the sigma-delta modulator and which includes an emulation of the signal path between the output of the sigma-delta modulator and the output of a power amplifier (107) connected downstream of said sigma-delta modulator.

13 Claims, 5 Drawing Sheets

SIGMA-DELTA MODULATOR WITH FEEDBACK FOR POWER AMPLIFIERS

CROSS REFERENCE TO RELATED APPLICATIONS

Reference is made to and priority claimed from German patent application Ser. No. 10 2006 055 577.5, filed Nov. 21, 2006.

BACKGROUND OF THE INVENTION

1. Technical Field

The invention concerns an electronic circuit having a sigma-delta modulator for a power amplifier.

2. Discussion of Related Art

Sigma-delta modulators (also referred to as delta-sigma modulators) with downstream-connected power amplifiers are used as highly efficient amplifier systems. This involves, for example, audio amplifier systems or transmitting stations for telecommunications. Frequently the power amplifiers are class S amplifiers. With that type of amplifier the input signal is not linearly amplified. Instead power transistors are switched on and off by means of pulsed signals at a high frequency. The result at the output of the power amplifiers is thus a pulse series which contains the analog signal for the load. The terminology is not uniform on a worldwide basis: depending on the respective author involved, such amplifier types are referred to as class S or class D (see, for example, Jack R Smith: 'Modern Communication Circuits', 2nd edition, McGraw-Hill 1998, Chapter 11.6, page 481). Hereinafter in the description of this invention, the term 'class S amplifier' is used for such switched amplifiers, the pulse series of which contains information in respect of the analog signal. Class S power amplifiers make it possible to provide output signals of high power with comparatively low thermal power losses. A suitable signal for the actuation of loads (such as loudspeakers or the like) is obtained from the pulsating high-frequency signal in reconstruction filters. In the simplest case the frequency response characteristic of the load can itself form the reconstruction filter if for example the loudspeaker cannot follow the high-frequency pulses but integrates them to afford a low-frequency analog signal. In a typical case, in a sigma-delta modulator the digital signal of an A/D converter (analog-digital converter), which can be, for example, a 1-bit signal from a comparator, is converted into an analog value in a D/A converter and fed as a correction value into the regulating loop of the sigma-delta modulator. Usually in that way, for example, the contribution due to the quantisation error of the A/D converter, that is to say the quantisation noise, is reduced so that it is possible to use low-resolution A/D converters. The 1-bit output signal of sigma-delta modulators has a sampling rate which is far above the required Nyquist frequency of the input signal. Accordingly the output signal of the sigma-delta modulator is like a signal as is required for operation of the power amplifiers. Both components are therefore advantageously used together. The feedback to the input of the sigma-delta modulator can not only reduce the quantisation error or the quantisation noise of the 1-bit A/D converters in the modulators. Other transmission errors in the forward path can also be compensated by further feedback. More extensive compensation is achieved, for example, by the feedback from the analog signal being effected after the power amplifier or a subsequent reconstruction filter. Transmission errors can be compensated in a larger part of the signal path in that way. Such feedback configurations can provide very high linearity in the entire system. The specified principle is therefore applied, for example, in the area of audio signal processing in which a high degree of linearity is desired.

Often however it is difficult to obtain a signal which is exactly proportional to the output signal, particularly in the case of higher-power amplifiers in which then a voltage divider or a current sensor must be incorporated into the output path. A further difficulty is encountered if the signal frequency is very high and the power amplifier is not on a common substrate (that is to say on the same chip) with the modulator. In such a situation stability problems and errors can occur due to an unwanted delay and changes occurring elsewhere in the fed-back signal. On the other hand integration of electronic components on a single substrate is not always possible, either because they require too much area, a suitable technology does not exist or an excessive power consumption or interference would be caused, which would entail excessive disadvantages for other components on the same substrate.

DISCLOSURE OF INVENTION

Therefore an object of the present invention is to afford the advantageous properties of the feedback without giving rise to the aforementioned disadvantages. In particular an object of the invention is to provide a high-frequency power amplifier system of high efficiency with a sigma-delta modulator with the desired linearity.

In accordance with an advantageous aspect of the invention, the object is attained by an electronic circuit comprising a sigma-delta modulator and a power amplifier connected downstream thereof, which has a feedback circuit which is coupled between an output of the sigma-delta modulator and an input of the sigma-delta modulator, and which includes an emulation of the signal path between the output of the sigma-delta modulator and the output of a power amplifier connected downstream of said sigma-delta modulator. In a simple case that emulation of the signal path is only an emulation of the power amplifier, for example a linearly reduced-scale image. Emulation of the signal path however, besides the power amplifier, can also emulate other components of the signal path between the output of the sigma-delta modulator and the output of the power amplifier, for example the frequency characteristic or the delay time in the connecting lines upstream or downstream of the power amplifier, or further components of the amplifier system disposed upstream or downstream of the power amplifier.

The invention therefore concerns circuits having sigma-delta modulators which are provided for power amplifiers or are intended to co-operate therewith. In that respect the properties of such power amplifiers arise out of the applications involved. In accordance with the invention accordingly the proposal is no longer to feed back to an input of the modulator the signals of the actual signal path which joins the sigma-delta modulator, but to emulate the signal path in question. The desired compensation or suppression by the feedback is then still achieved insofar as the emulation of the signal path correctly reproduces the error influences and provides the error magnitude resulting therefrom in a suitable fashion for the input. Particularly when the signals are subjected to further processing after leaving the sigma-delta modulator and as a result for example involve markedly higher signal levels, or are processed with components which consume a very great deal of electrical power, emulation can be highly advantageously implemented. Instead of providing for feedback of the actual signals, the output signal of the sigma-delta modulator is taken off directly or at a later location in subsequent signal processing, passed by way of a channel emulating the actual conditions, which advantageously emulates the errors in question (for example distortion and delays), and is then applied to the input of the modulator again. In an advantageous configuration the circuit is implemented in an integrated circuit arrangement on a semiconductor substrate. In a further advantageous configuration the integrated circuit also includes the power amplifier to be emulated.

In accordance with a further advantageous configuration of the feedback circuit, it includes an emulation of a reconstruction filter connected downstream of the power amplifier. Particularly in the high-frequency range, sine signals have to be reconstructed downstream of switching amplifiers, and what are referred to as reconstruction filters are used for that purpose. Frequently it is only with difficulty that reconstruction filters of that kind can be inexpensively implemented in the form of integrated circuits on a semiconductor substrate. On the other hand, the errors which are caused by such reconstruction filters can also be reduced by feedback of the output signals after passing through such filters. In such a situation, emulation of the signal path can very advantageously have the effect that external signals do not have to be taken off from the real filters and fed back, nor is it necessary to dispense with the feedback. Instead of that, an output signal of the emulated signal path can advantageously be employed. Emulation is advantageously effected with avoidance of the above-mentioned disadvantages. In that respect, for example, suitable integratable circuit components are used, which emulate only the specific required properties of the reconstruction filters. Emulation is therefore effected on the basis of the known properties of defined reconstruction filters of specific applications which however are not a component part of the circuit according to the invention.

In accordance with a further advantageous aspect of the invention, the power amplifier is a class S amplifier. Amplifiers of that kind are preferably provided for high-efficiency power amplifier systems. With those amplifier types, power transistors are switched on and off in a fast pulse series. The analog signal is modulated into a fast pulse series in that way, which provides a better power balance sheet for the amplifier than linear amplifiers. For example the above-discussed reconstruction filters are used following such amplifier types in order to reconstruct the analog signal from the fast pulse series. As the output signals of the power amplifiers are only poorly suited to direct feedback to the modulators, here emulation of the channel also has an advantageous effect in a simplified circuit. The higher the frequency of the analog signal is, the correspondingly more a delay in feedback has an adverse effect on the quality of the output signal. As the feedback in the solution according to the invention is not taken from a spatially remote power amplifier but is effected by means of an emulation which can be arranged very close to the modulating circuit, the delay can be kept substantially less than in the case of conventional amplifier systems in that class. That increases the possible quality and stability of amplification.

The advantage of the present invention advantageously comes to fruition when the emulation represents linear scaling of the power stage of the amplifier. Equally the simulation may include linear scaling of the filter or filters which are connected downstream of the modulator. Linear scaling of the components makes it possible to advantageously reduce the power losses, delays and the required areas, for example, for integration. Advantageously therefore in accordance with the present invention, the amplitude of the signals in the emulations is lower than the amplitudes of the corresponding signals.

The present invention therefore overcomes the disadvantages of the state of the art in that, instead of feedback from the real useful signal after the power amplifier, it employs feedback by way of an emulation of the signal path. That emulation is, for example, linear scaling of the power amplifier and the filter. As it is possible here to select a small scale, the amplitude which is to be processed can be optimised in relation to the requirements of signal processing so that the problems of accurate measurement of high currents or voltages and the problems involved in large spatial dimensions and delays that these entail do not arise.

The power amplifier is in any case often an array (that is to say for example a parallel circuit) of many transistors, which can be easily manufactured with a high level of accuracy on a linearly reduced scale and which can even be integrated with the modulator on a chip. By way of example, the power amplifier can be a push-pull stage with a respective array of 5000 LDMOS transistors and the emulation of the power amplifier may include a push-pull stage with only 5 such transistors respectively, which with suitable technology can be easily integrated with the modulator. That makes it possible to achieve very fast and also dynamically accurate feedback. Furthermore no energy for the feedback is taken from the power amplifier itself, as would otherwise be necessary for example by the inclusion of a series resistor for measurement of the output current.

In a further advantageous configuration the feedback circuit can be so designed that the emulation of the reconstruction filter compensates the remaining residual errors in the emulation of the power amplifier. In that respect account is advantageously taken of the fact that the emulation of the power amplifier is possibly incomplete or inaccurate. In order to compensate for that error the transfer function or the emulation of the reconstruction filter can be so designed in accordance with the invention that that disadvantage is taken into consideration and advantageously compensated.

In a further advantageous configuration, both emulations of the power amplifier and the reconstruction filter can also advantageously be combined to afford a single emulation which overall jointly emulates the properties of the power amplifier and the reconstruction filter. Thus the design of the emulation can be simplified because the emulations no longer have to be individually optimized, but only the overall function is still a target parameter.

In a further advantageous configuration, the emulation, besides the power amplifier and the reconstruction filter, can also involve further components in the signal path, for example the properties of connecting lines. In that way it is also possible to detect and compensate with the feedback frequency-dependent distortion phenomena and delays, due to such lines, which are involved in particular at high signal frequencies.

In a further advantageous configuration, the emulation can further also involve properties of the load at the output of the amplifier. In that way non-ideal properties of the load can also be detected and compensated with the feedback. By way of example the load can have a frequency-dependent impedance which is then also detected in the emulation and compensated by way of the feedback. In that way the frequency response characteristic can be linearized, with respect to the active power converted by the load, by way of the feedback, for example with respect to the transmission power of the antenna or the acoustic power of the loudspeaker.

In a further advantageous configuration, the emulation of properties of the signal path following the sigma-delta modulator (for example of the power amplifier and the reconstruction filter) can be entirely or partially effected by digital circuits, for example by digital FIR filters (FIR=finite impulse response). In that way the digital output signal of the A/D converter of the sigma-delta modulator can advantageously be subjected to further digital processing and the advantages of digital signal processing can be put to use, such as freely definable filter functions, flexibility and programmability. Before the output signal of the feedback circuit is fed into the summing member at the input of the sigma-delta modulator, the digital signal of the feedback circuit must be converted into an analog signal by suitable means, usually by a D/A converter.

In a further configuration, parameters of the feedback circuit can also be individually adapted to the specific example involved of the amplifier system and the precise properties of components thereof by means of digital programming, more accurately than in the case of a non-programmable solution, for example by evaluation of measurements at the load (such as a loudspeaker or antenna).

In addition, in a further variant of this configuration, individual adaptation can also implement such programmability of parameters of the feedback circuit variably in respect of time by evaluation of error signals, for example during operation or in relation to various events such as changes in temperature or interruptions in operation. That can also be effected automatically by an algorithm such as for example an optimization algorithm whose optimization criterion is a minimum EVM (error vector magnitude) or a minimum bit error rate or a minimum square error sum of a plurality of target values.

Further advantageous configurations of the present invention concern an amplifier system which, besides an electronic circuit which is designed in accordance with the foregoing aspects, also includes the power amplifier or amplifiers and the reconstruction filter or filters. In addition such an amplifier system can also include still other components.

The main area of application of the present invention is class S switching amplifiers which cannot be integrated with the modulator on a chip, either because of the high power (for example high-power audio amplifiers or power high-frequency amplifiers) or because of the high voltage which requires switching transistors of a different technology from that of the modulator. The invention is advantageously suitable in particular for high-efficiency linear transmission amplifier systems.

BRIEF DESCRIPTION OF THE DRAWINGS

The present invention is described by way of example hereinafter by means of embodiments with reference to the accompanying Figures in which.

DETAILED DESCRIPTION

Figure 1:
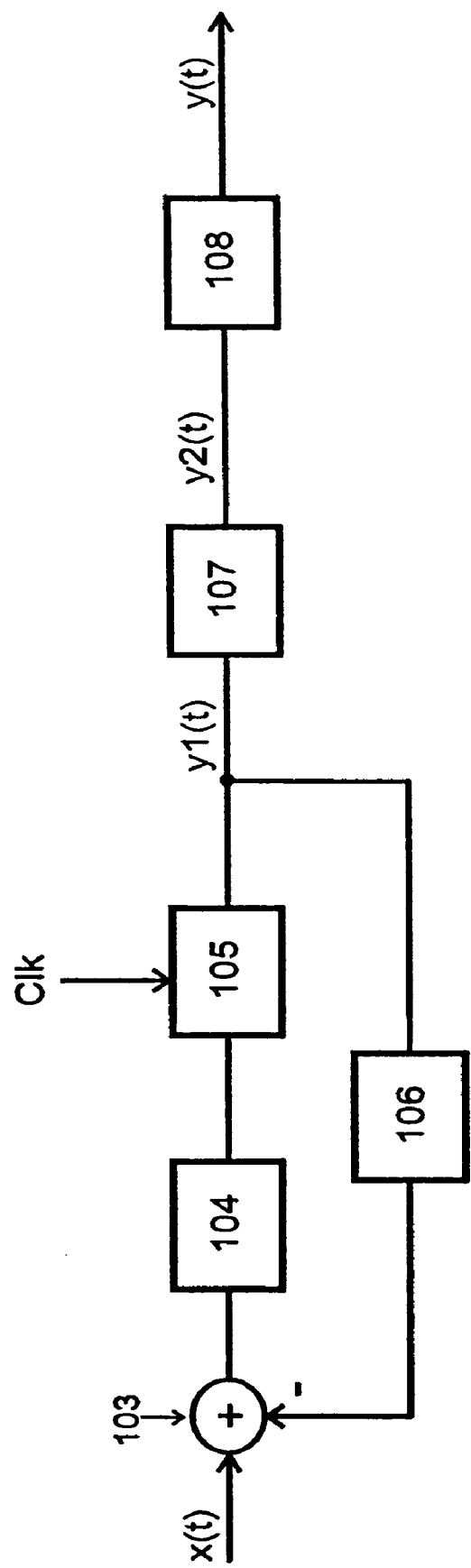
FIG. 1 is a simplified view of a circuit in accordance with the state of the art.

FIG. 1 shows a simplified view of a circuit in accordance with the state of the art. An input signal x(t) is passed to a summing member 103. In the summing member 103 the fed-back output signal y1(t) of the sigma-delta modulator, which was converted into an analog signal again by the D/A converter 106, is subtracted. The difference of the input signal x(t) and y1(t) is applied to a filter 104 with the transfer function H(z). After filtering, the signal is subjected to analog-digital conversion in the analog-digital converter 105 at a predetermined clock Clk. Analog-digital conversion is typically effected with an analog-digital converter 105 with a low level of resolution, preferably 1 bit. The output signal y1(t) produced in that way is fed to a power amplifier 107. After amplification is effected, the output signal y2(t) of the power amplifier 107 is passed to the filter 108 (for example a reconstruction filter) in order to reconstruct from the output signal y2(t) the actual actuation signal (t) for driving, for example, loudspeakers or transmission antennae. Typically the power amplifier 107 is a class S amplifier. With that type of amplifier the input signal is not linearly amplified but power transistors are switched on and off in very fast succession, for example by means of a pulse density-modulated signal. At the output there is a pulse series which contains the low-frequency actuation signal for driving the loudspeakers. Class S power amplifiers make it possible to provide high-power output signals with comparatively low thermal power losses. The transfer function H(z) in the block 104 of the sigma-delta modulator and also the other components of the sigma-delta modulator 105 and 106 as well as the sampling rate Clk are selected in accordance with the demands for the specific application. The output signal y1(t) of the sigma-delta modulator involves a sampling rate which is above the required Nyquist frequency of the input signal y(t). The feedback shown in FIG. 1 by means of the D/A converter 106 provides that the sigma-delta modulator provides for shaping of the power density spectrum of the quantization noise, with respect to the quantization noise of the A/D converter 105. Preferably that measure causes a shift in noise components outside the useful signal bandwidth, which can be removed later, for example, in the filter 108. As the power amplifier 107 also has to be operated with a high-frequency pulse signal, a combination of sigma-delta modulators and class S power amplifiers 107 presents itself as appropriate.

Figure 2:
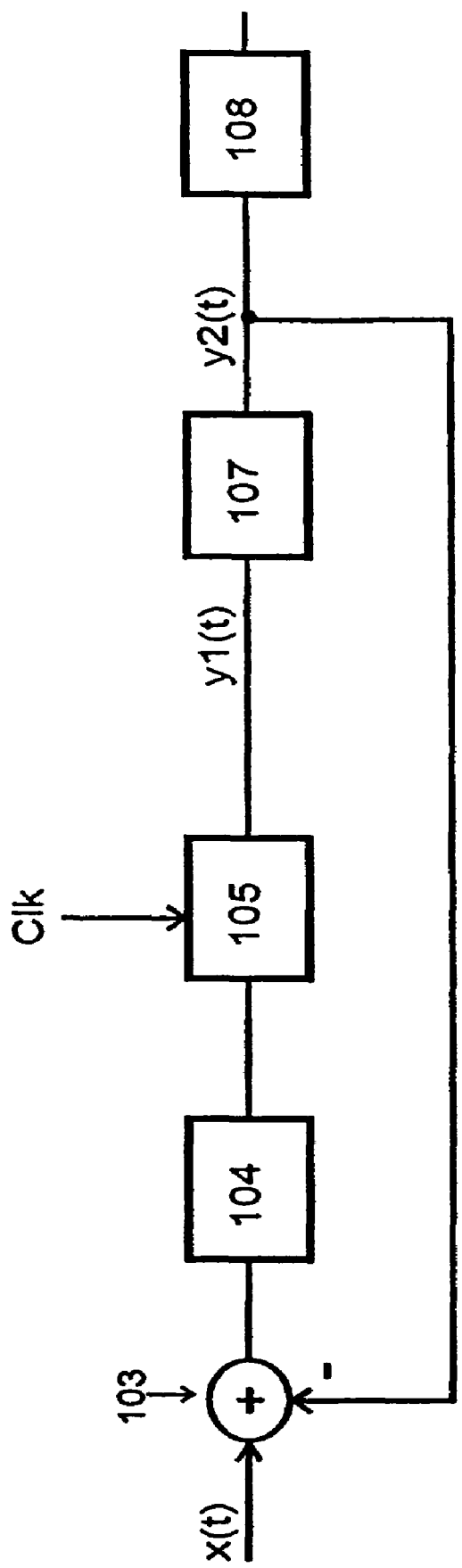
FIG. 2 is a simplified view of a circuit in accordance with the state of the art with a feedback by way of the power amplifier.

FIG. 2 shows a simplified view of a circuit in accordance with the state of the art which in comparison with FIG. 1 has a more extensive feedback. In this case the output signal of the analog-digital converter 105, namely y1(t), is now no longer fed back to the summing member 103 by means of a digital-analog converter, but instead thereof it is the output signal of the power amplifier 107, that is to say the signal y2(t). Equally, as previously described in relation to the quantization noise of the A/D converter 105, the noise which occurs due to the power amplifier 107 or also other interference caused thereby is now also suppressed by means of the total transfer function of the loop formed in that way. In comparison with the architecture shown in FIG. 1, the architecture illustrated in FIG. 2 therefore affords the advantage that non-idealities which originate from the power amplifier 107 are totally suppressed by the configuration of the filter function H(z) of the sigma-delta modulator, that is represented in the block 104.

Figure 3:
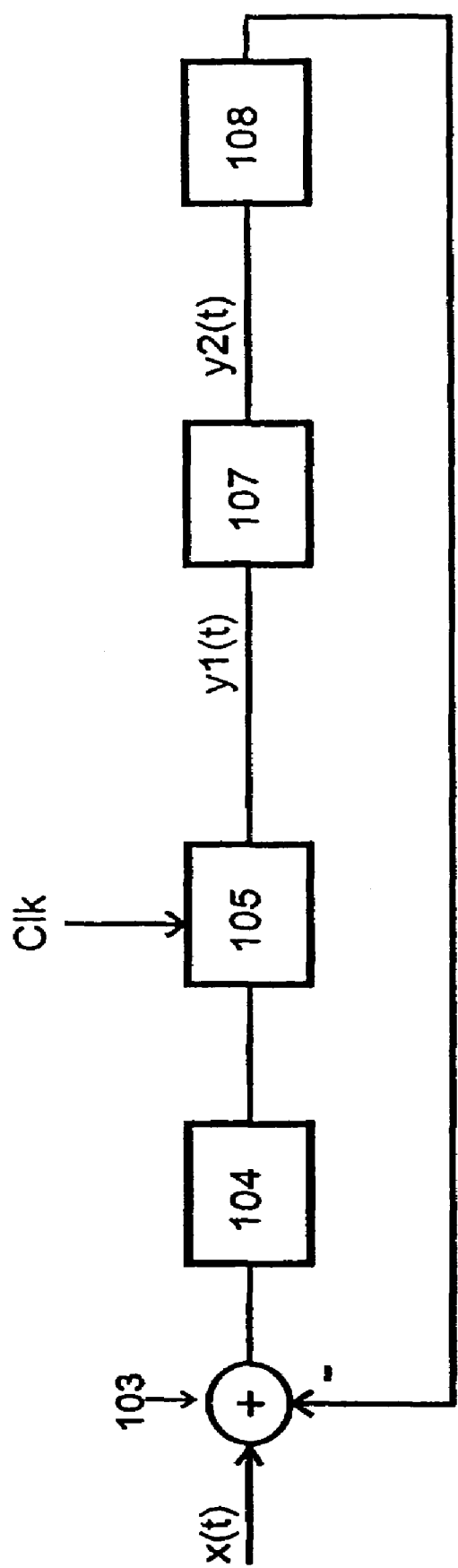
FIG. 3 is a simplified view of a circuit in accordance with the state of the art with a feedback by way of the power amplifier and the reconstruction filter.

FIG. 3 shows a simplified view of a circuit in accordance with the state of the art, representing a further variant for a feedback in relation to FIGS. 1 and 2. In accordance therewith the output signal of the filter 108, that is to say the output signal y(t), is now fed back to the summing member 103 and subtracted from the input signal x(t). Equally, as described hereinbefore in relation to the power amplifier 107, the filter 108 is now also included in the loop. That means that disturbances which occur in the filter 108 are also reduced by means of the loop function.

Figure 4:
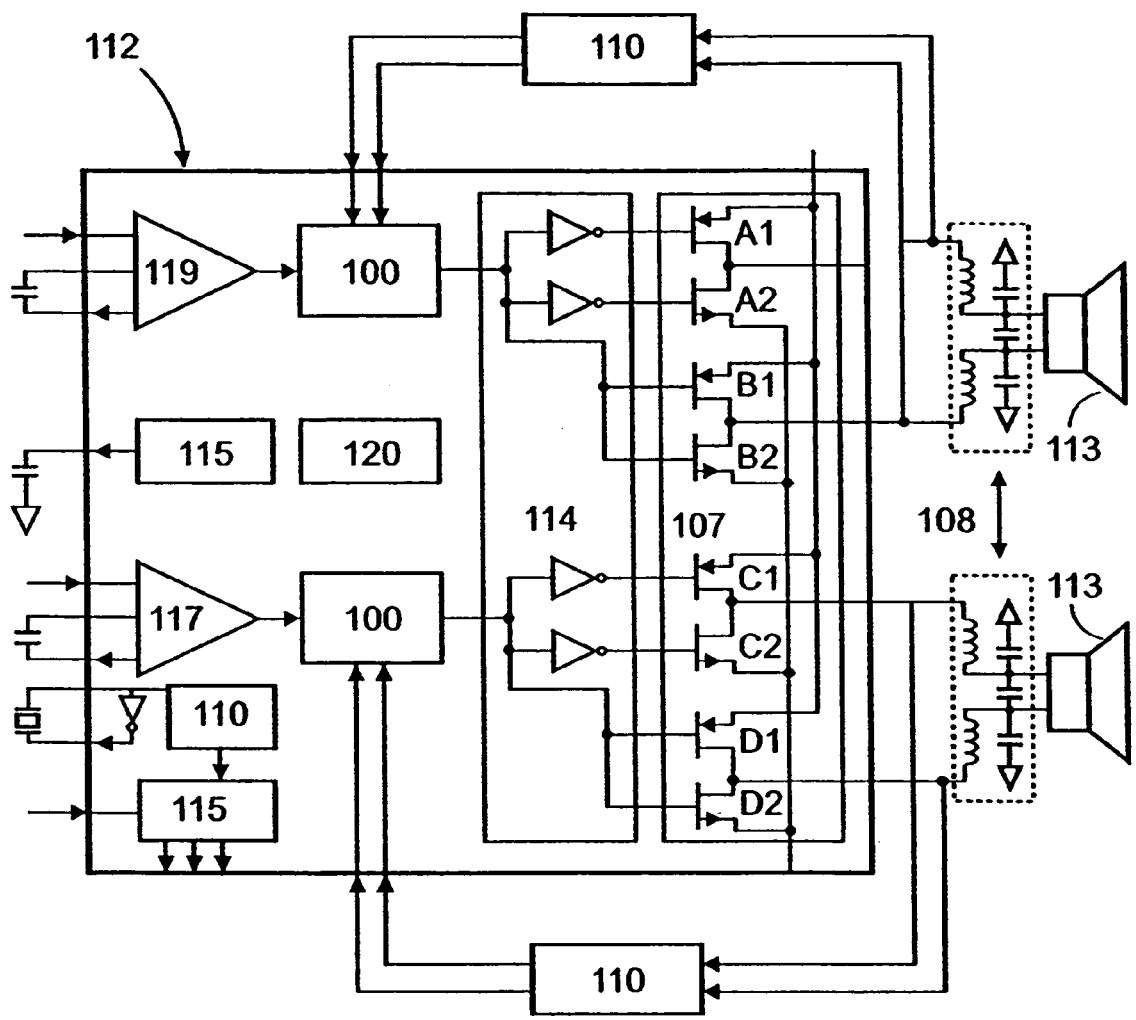
FIG. 4 is a simplified view of a circuit in accordance with the state of the art with feedback by way of the power amplifier.

FIG. 4 shows a block diagram of a conventional circuit which implements the architecture shown in FIG. 2. The feedback loop is closed back to the sigma-delta modulators 100 by means of the feedback network 110 after leaving the power amplifiers 107. The circuit illustrated in FIG. 4 has two channels for a stereo application, that is to say a left channel and a right channel. Each of the channels includes power amplifiers 107 and reconstruction filters 108 which are frequently arranged outside the integrated circuit 110, particularly when high frequencies or very high powers are involved. In the present example in FIG. 4 for a lower-power audio amplifier however the power amplifiers 107 and the reconstruction filters 108 are arranged within the integrated circuit 112. The loudspeakers 113 are operated by the output signals from the reconstruction filters 108. The power amplifiers 107 each include four transistors A1, A2, B1, B2, C1, C2, D1, D2. Each two of the transistors are provided in pairs as high side and low side drivers for a connection of a loudspeaker 113. The respective output signal of the sigma-delta modulators 100 is respectively applied to a level matching circuit 114 which passes the signals either by way of two inverters or directly to the gate terminals of the MOSFET transistors. The quickly changing output signal of the sigma-delta modulators 100 then causes the transistors A1, A2, B1, B2, C1, C2, D1, D2 to be switched on and off in rapidly changing fashion, which causes modulation of the low-frequency audio signal.

Figure 5:
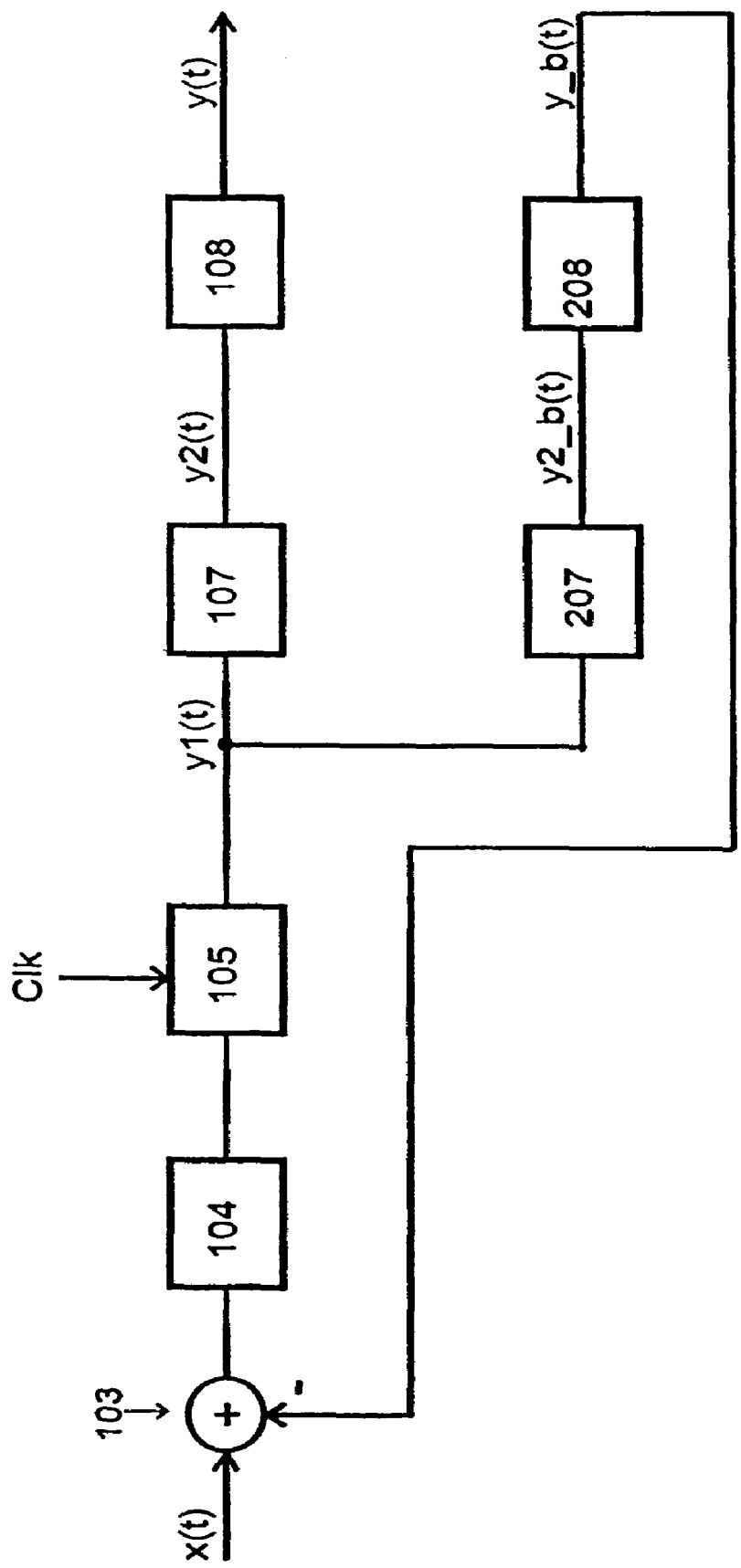
FIG. 5 shows a simplified view of a circuit in accordance with an embodiment of the present invention.

FIG. 5 shows a simplified view of a circuit in accordance with an embodiment of the present invention, as can be used to improve the circuits shown in FIGS. 1 through 4. In accordance with the invention therefore the feedback loop is not closed by way of the power amplifier 107 and the filter 108, but a parallel path is constructed with the components 207 and 208. The output signal of the A/D converter 105, namely $y1(t)$, thus goes to the power amplifier 207 and the filter 208 (reconstruction filter) which both represent an emulation of the power amplifier 107 and the filter 108 respectively. That makes it possible to overcome various disadvantages in the conventional system. That includes for example the point that the reconstruction filter 108, as is shown in FIG. 4, frequently cannot be integrated into an integrated circuit. Emulation of the filter 208 can however be such that integration is possible. The same applies to the emulation 207 of the power amplifier 107. In particular the emulations 207 and 208 can possibly be designed to be markedly smaller, with lesser delay and of lower power, than the actual power amplifier 107 and the actual filter 108. The smaller delay of the shorter electrical signal path by way of the emulations makes it possible to use a feedback at substantially higher frequencies than in the case of conventional amplifier systems, the feedback of which includes a power amplifier 107 which is spatially remote or which is of extensive dimensions.

The signals $y2\_b(t)$ and $y\_b(t)$ can do justice in particular in respect of their amplitudes to the conditions at the sigma-delta modulator without further scaling having to take place. If the emulation is carefully implemented then the loop function which is now closed by way of the power amplifier 207 and the filter 208 behaves as if the output signal y(t) were fed thereto. The noise components or errors produced by the components 107 and 108 are accordingly also suppressed with this configuration because the output signal $y1(t)$, which also goes to the power amplifier 107, is matched in such a way that it does justice to the error components which are later added by the components 107 and 108.

What is claimed is:

1. An electronic circuit comprising:
   a sigma-delta modulator, and
   a power amplifier connected downstream thereof, wherein there is provided a feedback circuit (207) which is coupled between an output of the sigma-delta modulator and an input of the sigma-delta modulator and which includes an emulation of the signal path between the output of the sigma-delta modulator and the output of a power amplifier (107) connected downstream of said sigma-delta modulator.

2. An electronic circuit as set forth in claim 1, wherein the feedback circuit further includes an emulation (208) of a reconstruction filter (108) connected downstream of the power amplifier (107).

3. An electronic circuit as set forth in claim 1 wherein the power amplifier (107) is a class S or class D amplifier.

4. An electronic circuit as set forth in claim 1, wherein the emulation (207) is a linear scaling of the power amplifier (107).

5. An electronic circuit as set forth in claim 1, wherein the emulation (208) is a linear scaling of the filter (108).

6. An electronic circuit as set forth in claim 1, wherein the amplitudes of the signals $y2\_b(t)$, $y\_b(t)$ in the emulations (207, 208) are lower than the amplitudes of the corresponding signals.

7. An electronic circuit as set forth in claim 2, wherein the feedback circuit is so designed that it compensates the remaining residual errors in emulation of the power amplifier by the emulation of the reconstruction filter.

8. An electronic circuit as set forth in claim 2, wherein the feedback circuit is so designed that it includes combined in a single emulation the emulation (207) of the power amplifier (107) and the emulation (208) of the reconstruction filter (108).

9. An electronic circuit as set forth in claim 1, wherein the feedback circuit is so designed that it also involves further components in the signal path, for example the properties of connecting lines.

10. An electronic circuit as set forth in claim 1, wherein the feedback circuit is so designed that it also involves properties of the load at the output of the amplifier.

11. An electronic circuit as set forth in claim 1, wherein the feedback circuit includes digital circuits for signal processing.

12. An electronic circuit as set forth in claim 1, wherein parameters of the feedback circuit are adapted by means of programming to individual properties of components in the signal path.

13. An electronic circuit as set forth in claim 12, wherein adaptation of parameters of the feedback circuit is effected variably in respect of time by assessment of error signals.

* * * * *